United States Patent
Suzuki et al.

(10) Patent No.: US 7,575,661 B2
(45) Date of Patent: Aug. 18, 2009

(54) REACTIVE SPUTTERING METHOD

(75) Inventors: Yasuyuki Suzuki, Kanagawa (JP); Koji Teranishi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 880 days.

(21) Appl. No.: 10/898,956

(22) Filed: Jul. 27, 2004

(65) Prior Publication Data

US 2005/0023130 A1 Feb. 3, 2005

(30) Foreign Application Priority Data

Jul. 31, 2003 (JP) .............................. 2003-283397

(51) Int. Cl.
*C23C 14/35* (2006.01)
(52) U.S. Cl. ..................... 204/192.12; 204/192.26; 204/192.27; 204/298.07; 204/298.12; 204/298.18; 204/298.23
(58) Field of Classification Search ............ 204/192.15, 204/192.12, 192.26, 192.27, 192.28, 192.13, 204/298.03, 298.07, 298.12, 298.17, 298.18, 204/298.23
See application file for complete search history.

(56) References Cited

U.S. PATENT DOCUMENTS

| | | | |
|---|---|---|---|
| 4,006,070 A * | 2/1977 | King et al. ............. | 204/192.29 |
| 6,210,744 B1 | 4/2001 | Hayess et al. .................. | 427/8 |
| 6,458,253 B2 * | 10/2002 | Ando et al. ............. | 204/192.15 |
| 6,649,036 B2 * | 11/2003 | Hirata et al. ........... | 204/298.18 |

FOREIGN PATENT DOCUMENTS

| | | | |
|---|---|---|---|
| EP | 1 134 303 A1 | * | 9/2001 |
| EP | 1 184 483 A2 | * | 3/2002 |
| JP | 5-243155 | | 9/1993 |
| JP | 5-320891 | | 12/1993 |
| JP | 06-172995 | | 6/1994 |
| JP | 2000-514497 | | 10/2000 |
| JP | 2001-500569 | | 1/2001 |

* cited by examiner

*Primary Examiner*—Rodney G McDonald
(74) *Attorney, Agent, or Firm*—Fitzpatrick, Cella, Harper & Scinto

(57) ABSTRACT

In a reactive sputtering apparatus, an inert-gas supplying hole is provided in a movable target unit whose one end is open and whose conductance is controlled, and a reactive gas containing at least fluorine or oxygen can be supplied to a space between the target and a substrate. The apparatus is constructed so as to emit the reactive gas toward the substrate. A reactive-gas emitting location is in the space between the target and the substrate such that a concentration of the reactive gas on the substrate surface can be maintained at a higher level. When the target is moved, a reactive-gas emitting port is moved or the reactive-gas emitting location is changed. The concentration of the reactive gas on the substrate surface can be effectively kept constant, and a high-quality optical thin film can be formed.

2 Claims, 3 Drawing Sheets

REACTIVE SPUTTERING METHOD

BACKGROUND OF THE INVENTION

1. Field of the Invention

The present invention relates to a reactive sputtering method, and more particularly to a reactive sputtering method that can be suitably used for formation of optical thin films, such as an antireflection film and a dielectric multi-layer mirror, usable in optical components for a visible wavelength range and an ultraviolet wavelength range, for example.

2. Description of the Related Art

Conventionally, when optical thin films, such as an antireflection film and a mirror, are formed, a vacuum evaporation method is chiefly used in which a film-forming material is heated in a vacuum using an electron beam or the like, and the material is evaporated and deposited on a substrate.

In general, an antireflection film, a mirror and the like include multi-layers or the like formed of either of a low-refractive-index material, such as a magnesium fluoride ($MgF_2$), and a high-refractive-index material, such as a zirconium oxide ($ZrO_2$), a tantalum oxide ($Ta_2O_5$) and a titanium oxide ($TiO_2$), or a combination thereof, respectively. The layer structure, film thickness and the like are variously adjusted in accordance with optical performances required.

Although a vacuum evaporation method is a film-forming method typically conducted in a simple apparatus is simple, in which a film can be formed on a large-area substrate at a high rate, and which provides excellent productivity, the vacuum evaporation technique has the following disadvantages. It is difficult to control the film thickness with high precision, and develop an automatic producing apparatus. When the film formation is performed under a condition at a low substrate temperature, the strength of a film is likely to become insufficient and a film is liable to be easily damaged. Further, a degree of close contact between a film and a substrate is low.

In recent years, the demand for productivity efficiency has increased. Accordingly, also in the field of such optical thin films, there is an increasing demand for a coating by a sputtering method that is more advantageous in simplification or decrease in consumption energy of a process, stability of quality, film quality (a degree of close contact and a film strength), and so forth, as compared with a vacuum evaporation method.

When a dielectric thin film of an oxide, such as a zirconium oxide ($ZrO_2$), a tantalum oxide ($Ta_2O_5$), a titanium oxide ($TiO_2$) and an aluminum oxide ($Al_2O_3$), is formed by the sputtering method, a high-refractive-index thin film having a low absorptivity can be readily obtained. In the formation of the oxide thin film, however, the sputtering rate is very slow. In the event that a partial pressure of oxygen is reduced and an applied electrical power is increased to increase the sputtering rate, a metal-like film having a large absorptivity is inevitably formed and it is quite difficult to obtain a low-absorptivity thin film stably and rapidly.

Further, it is not easy to form a low-absorptivity thin film of a metal fluoride, such as $MgF_2$ and $AlF_3$, whose refractive index is low, for example below 1.45, which is an important thin-film material that largely influences optical performances of a multi-layer optical thin film, and which is a low-absorptivity material in a range from the visible wavelength to the ultraviolet wavelength.

For example, Japanese Patent Application Laid-Open No. 5(1993)-243155 (JPLO-05-243155) discloses a method of forming such a thin film using a sputtering method. In this method, a sputtering gas is uniformly introduced into a place near a target and a reactive gas is uniformly admitted to a place near a substrate to perform a reactive sputtering.

Further, Japanese Patent Application Laid-Open No. 5(1993)-320891 (JPLO-05-320891) discloses a method in which a sputtering gas is introduced through a small hole formed in a metal target, and a reactive gas is introduced through a ring-shaped conduit to perform a reactive sputtering.

In the event that an $Al_2O_3$ thin film most generally used as an optical thin-film material is formed by a sputtering method, a metal Al is used as a target material and a gas, such as $O_2$, is admitted as a reactive gas to form a thin film by a reactive sputtering method.

In the method of JPLO-05-243155, the gas is introduced uniformly from peripheries of the target and the substrate to make the reactivity uniform.

In the method of JPLO-05-320891, the sputtering gas is admitted uniformly from the target provided with an admitting hole to unify the reactivity.

In the above-discussed methods, however, a DC sputtering cannot be stably performed since the reactive gas reacts on a surface of the target. Further, problems of a slow sputtering rate and so forth occur. Moreover, it is difficult to stabilize a surface condition of the target and stabilize the sputtering rate.

SUMMARY OF THE INVENTION

It is an object of the present invention to provide a reactive sputtering method which is capable of speedily and stably forming even a thin film of metal fluoride, metal oxide or the like that is transparent and non-absorptive in a range from visible wavelengths to ultraviolet wavelengths, for example.

According to one aspect of the present invention, there is provided a reactive sputtering method which includes a step of disposing in an apparatus a hollow target with an opening portion provided at least at one end thereof and a supplying hole for admitting an inert gas into the interior thereof, and a substrate; and a step of performing sputtering by admitting an inert gas into the target through the supplying hole while spraying a reactive gas toward a surface of the substrate.

In a method of the present invention, an inert gas, such as Ar, Xe and Kr, is introduced into a cylinder-like hollow target through a supplying hole, and at the same time a reactive gas, such as a gas including fluorine or oxygen, is sprayed toward a surface of the substrate.

Therefore, reaction of the reactive gas on a surface of the target can be avoided, and formation of a reaction-created substance on the target surface can be hence prevented. In other words, since a metal condition on the target surface can be maintained at all times, a large sputtering rate can be stably secured. Further, since a large concentration of the reactive gas can be attained on the substrate surface, a stable reaction can be maintained. Particularly, it is possible to increase a partial pressure of the reactive gas at a central portion of the target at which significant amounts of sputtering particles arrive, a sufficient reactivity can be secured.

The above and other objects, features, and advantages of the invention will become more apparent from the following detailed description taken in conjunction with the accompanying drawings.

DESCRIPTION OF THE PREFERRED EMBODIMENTS

Figure 1:
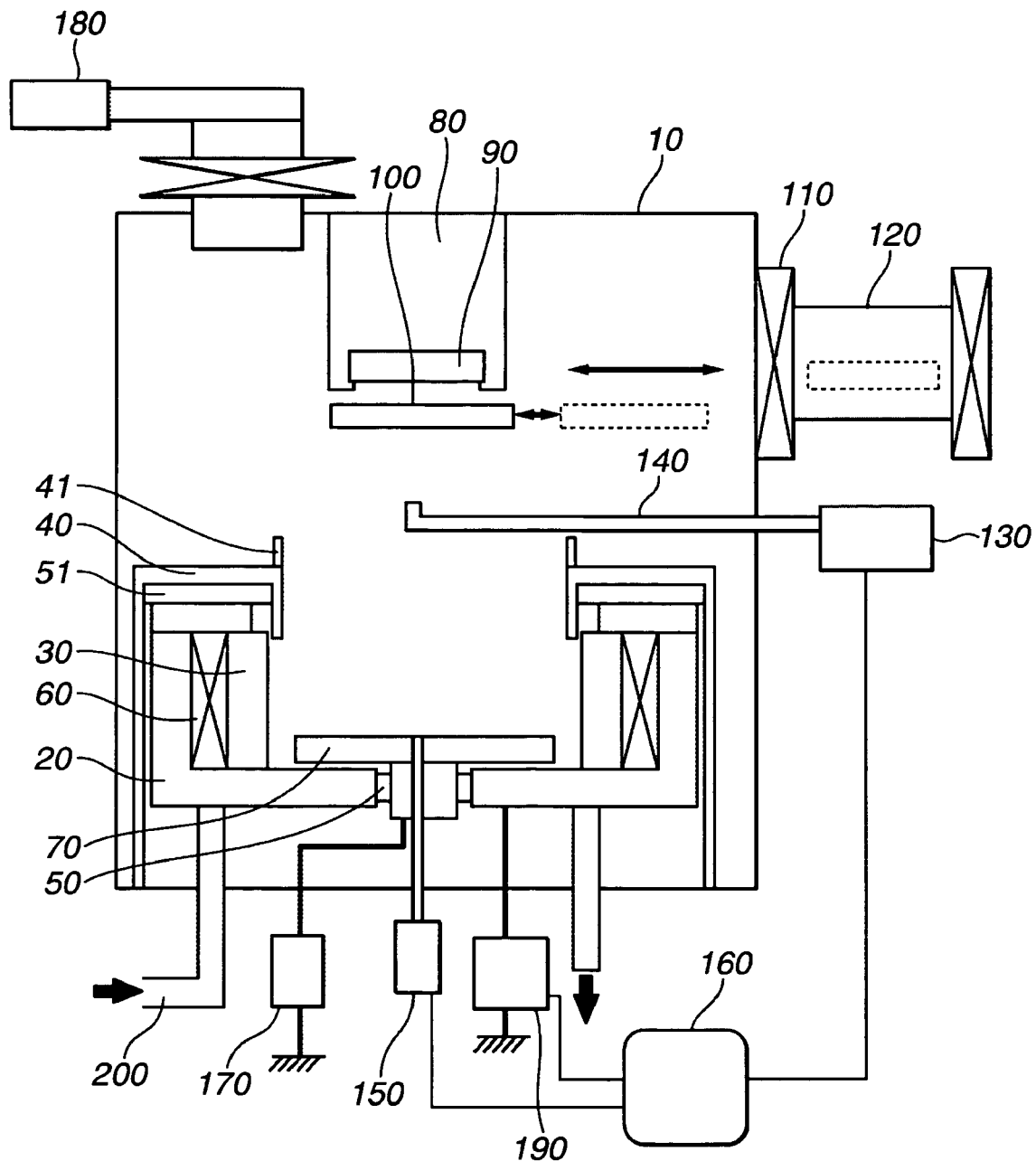
FIG. 1 is a cross-sectional view illustrating a first example of a DC magnetron sputtering apparatus according to the present invention.

Preferred embodiments of the present invention will hereinafter be described.

In a first embodiment of the present invention, a cylindrical target with an opening portion provided at least at one end thereof and a supplying hole for admitting an inert gas into the interior thereof, and a substrate are disposed in an apparatus, and sputtering is performed by admitting an inert gas into the target through the supplying hole while spraying a reactive gas toward a surface of the substrate.

In a second embodiment of the present invention, the sputtering is performed in the first embodiment such that the reactive gas is not diffused in an inverse direction. Almost no reaction occurs between the reactive gas and the target when the inverse diffusion of the reactive gas is prevented. Accordingly, a high sputtering rate can be more stably secured. Further, since a higher concentration of the reactive gas can be attained on the substrate surface, a more stable reaction can be maintained.

In a third embodiment of the present invention, the sputtering is performed in the first or second embodiment by controlling a partial pressure of the reactive gas on the target surface. When the partial pressure of the reactive gas near the target is controlled to be lower than that at other portions, the inverse diffusion of the reactive gas can be reduced more assuredly.

In a fourth embodiment of the present invention, the partial pressure of the reactive gas is controlled while a surface condition of the target is observed in the third embodiment. For example, when light emission on the target surface is spectrally measured and the partial pressure of the reactive gas is controlled such that the level of emission color of a metal of the target is maintained, a stable and high-rate sputtering condition can be obtained more assuredly.

In a fifth embodiment of the present invention, a conductance between the target and the substrate is made equal to or less than 5 m$^3$/s in any one of the first to fourth embodiments.

When the conductance between the target and the substrate is controlled, the inverse diffusion of the reactive gas can be effectively reduced. Particularly, when the conductance is made equal to or less than 5 m$^3$/s, the inverse diffusion of the reactive gas drastically decreases with a value of 5 m$^3$/s being a critical boundary. The conductance can be controlled by inserting a plate between the target and the substrate, especially on a side of the target, for adjusting an area of the opening portion, for example. It is preferable to change the area of the opening portion by a plural-plate structure similar to a shutter of a camera.

In a sixth embodiment of the present invention, an emitting port of a conduit for supplying the reactive gas is disposed in a space between the target and the substrate in any one of the first to fifth embodiments. The concentration of the reactive gas on the substrate surface can be hence maintained at a higher level. As a result, a more stable reaction can be attained.

In a seventh embodiment of the present invention, the sputtering is performed while the target is moved in any one of the first to sixth embodiments. In the event that a film is uniformly formed on a large area by moving the target, a position for admitting the reactive gas can be changed in an interlocking relationship with a position of the target. Accordingly, the above-discussed high-rate and stable sputtering condition can be maintained.

In an eighth embodiment of the present invention, the emitting port of the reactive gas is also moved together with the movement of the target, and sputtering is performed while a relative positional relation between the target and the reactive-gas admitting port is kept constant at all times in the seventh embodiment.

Since the relative positional relation between the target and the reactive-gas admitting port is kept constant at all times, the reactive-gas admitting port is always positioned in a space between the target and the substrate. Therefore, there occurs no variation of the partial pressure of the reactive gas on the target surface, and the inverse diffusion of the reactive gas can be assuredly prevented irrespective of the position of the target.

In a ninth embodiment of the present invention, a conduit with plural emitting ports is used to supply the reactive gas, and sputtering is performed while a relative positional relation between the target and the reactive-gas admitting location is kept constant by changing the reactive-gas emitting port in accordance with the movement of the target in the seventh embodiment. The reactive-gas emitting port is always positioned in a space between the target and the substrate. Accordingly, there occurs no variation of the partial pressure of the reactive gas on the target surface, and the inverse diffusion of the reactive gas can be assuredly prevented irrespective of the position of the target.

In a tenth embodiment of the present invention, the reactive gas is a gas containing fluorine in any one of the first to ninth embodiments. The reactivity of a gas containing fluorine relative to the target is strong among reactive gases, different from a nitrogen gas. Therefore, the advantageous effects of the present invention are more outstanding in this case.

In an eleventh embodiment of the present invention, the gas containing fluorine includes at least one of F$_2$, NF$_3$ and CF$_4$ in the tenth embodiment.

In a twelfth embodiment of the present invention, the reactive gas is a gas containing oxygen in any one of the first to tenth embodiments. Advantageous effect of the present invention is specially outstanding in a reactive sputtering using a highly-reactive gas such as fluorine and oxygen. In other words, oxygen also easily reacts with the target, and advantageous effect of the present invention is accordingly outstanding in this case.

In a thirteenth embodiment of the present invention, the gas containing oxygen contains at least one of O$_2$ and H$_2$O (as water vapor) in the twelfth embodiment.

In a fourteenth embodiment of the present invention, the conductance of the emitting port for the reactive gas is made equal to or less than $1 \times 10^{-4}$ m$^3$/s in any one of the first to thirteenth embodiments. It becomes difficult for the reactive gas to enter a side of the target when the conductance of the emitting port for the reactive gas is made equal to or less than $1 \times 10^{-4}$ m$^3$/s.

In a fifteenth embodiment of the present invention, an emitting speed of the reactive gas is made equal to or more than 50 m/s in any one of the first to fourteenth embodiments. The partial pressure of the reactive gas near the substrate can be increased and the reaction on the substrate surface can be advanced when the emitting speed of the reactive gas is made equal to or more than 50 m/s.

In a sixteenth embodiment of the present invention, there is provided a film formed by a reactive sputtering method recited in any one of the first to fifteenth embodiments. A film having stable characteristics can be obtained since the film formation is executed by a stabilized sputtering.

In a seventeenth embodiment of the present invention, the film is a film formed of fluoride or oxide in the sixteenth embodiment. For example, the film is a film of fluoride, such as $MgF_2$, $LaF_3$, $YF_3$ and $AlF_3$, or oxide, such as $Al_2O_3$, $SiO_2$, $Ta_2O_5$ and $TiO_2$.

In an eighteenth embodiment of the present invention, the film is an optical thin film. An optical thin film which is both transparent and non-absorptive in a range from the visible light wavelength to the ultraviolet light wavelength can be obtained.

In a nineteenth embodiment of the present invention, the optical thin film is an antireflection film or a dielectric multi-layer mirror of the seventeenth embodiment.

In a twentieth embodiment of the present invention, there is provided a reactive sputtering apparatus which includes a vacuum chamber, a unit for holding in the vacuum chamber a cylindrical target with an opening portion provided at least at one end thereof and a supplying hole for admitting an inert gas into the interior thereof, a unit for mounting a substrate, a unit for admitting an inert gas into the target through the supplying hole, and a unit for supplying a reactive gas while spraying the reactive gas toward a surface of the substrate.

In a twenty-first embodiment of the present invention, a conductance between the target and the substrate is controlled to be equal to or less than a predetermined value in the twentieth embodiment.

In a twenty-second embodiment of the present invention, the conductance between the target and the substrate is made equal to or less than 5 $m^3/s$ in the twenty-first embodiment.

In a twenty-third embodiment of the present invention, an emitting port for supplying the reactive gas is disposed in a space between the target and the substrate in any one of the twentieth to twenty-second embodiments.

In a twenty-fourth embodiment of the present invention, the target is movable in any one of the twentieth to twenty-third embodiments.

In a twenty-fifth embodiment of the present invention, the emitting port of the reactive gas is also movable together with the movement of the target, and a relative positional relation between the target and the reactive-gas admitting port can be kept constant at all times in the twenty-fourth embodiment.

In a twenty-sixth embodiment of the present invention, a conduit with plural emitting ports is used to supply the reactive gas, and the reactive-gas emitting port is changeable in accordance with the movement of the target in the twenty-fourth embodiment.

In a twenty-seventh embodiment of the present invention, the reactive gas is a gas containing fluorine in any one of the twentieth to twenty-sixth embodiments.

In a twenty-eighth embodiment of the present invention, the gas containing fluorine includes at least one of $F_2$, $NF_3$ and $CF_4$ in the twenty-seventh embodiment.

In a twenty-ninth embodiment of the present invention, the reactive gas is a gas containing oxygen in any one of the twentieth to twenty-eighth embodiments.

In a thirtieth embodiment of the present invention, the gas containing oxygen contains at least one of $O_2$ and $H_2O$ (water vapor) in the twenty-ninth embodiment.

In a thirty-first embodiment of the present invention, the conductance of the emitting port for the reactive gas is made equal to or less than $1\times10^{-4}$ $m^3/s$ in any one of the twentieth to thirtieth embodiments.

In a thirty-second embodiment of the present invention, an emitting speed of the reactive gas is made equal to or more than 50 m/s in any one of the twentieth to thirty-first embodiments.

A first example of the present invention directed to a DC sputtering apparatus will be described with reference to the drawings.

FIG. 1 illustrates a cross section of a DC magnetron sputtering apparatus according to the first example. As illustrated in FIG. 1, the sputtering apparatus is provided with a vacuum chamber 10 for keeping an inside of the apparatus under an approximately vacuum condition, and an evacuating system 180 for evacuating the vacuum chamber 10, such as a vacuum pump.

In the vacuum chamber 10, there is provided a circular (for example, cylindrical, conical or the like) hollow magnetron sputtering source which includes a circular hollow magnetron sputtering electrode 20 that is provided with a cooling unit 200 and has an opening portion at its one end, an anodic electrode 70 disposed with an insulating member 50 sandwiched between this anodic electrode and the circular hollow electrode 20, a ground electrode 40 disposed with an insulating member 51 sandwiched between the ground electrode and the circular hollow electrode 20, a sputtering-gas supplying apparatus 150 for supplying a plasma creating gas to the hollow portion, a circular hollow metal target 30 in contact with the hollow electrode 20, and a magnet 60 and a yoke for generating a magnetic circuit on a surface of the target 30. An electrical potential of the anodic electrode 70 can be controlled by a DC power source 170. A chimney 41 for controlling a conductance is provided between the target 30 and a substrate 90 such that a flow of the sputtering gas can be regulated.

A sputtering electrical power created by superposition of a DC bias and a high-frequency wave at 1 kHz to 500 kHz or a square wave can be applied to the circular hollow magnetron sputtering electrode 20 by a sputtering power source 190. Electrical discharge can be established on the target surface by that electrical power, and the target can be subjected to sputtering.

The substrate 90 to be treated is held by a holding mechanism 80, facing the anodic electrode 70 with the target 30 being disposed between the substrate 90 and the electrode 70. A shutter 100 is arranged between the substrate 90 and the target 30 in a rapidly movable manner. Such an arrangement is designed such that a line perpendicular to the surface of the target 30 to be sputtered does not intersect the substrate 90 to be treated.

The substrate is conveyed in a load-lock chamber 120 through a gate valve 110 such that the substrate can be conveyed into or from the vacuum chamber 10 without being exposed to the atmosphere.

A reactive-gas admitting mechanism 130 is disposed between the target 30 and the substrate 90 to be treated. The mechanism 130 has a single gas emitting port 140 for spraying a reactive gas toward the substrate 90. The structure is designed such that the gas can be emitted into a space between the target 30 and the substrate 90. The conductance of the gas emitting port is set equal to or less than $1\times10^{-4}$ $m^3/s$, and the emission rate of the reactive rate is made high. A flow of the reactive gas, a flow of the gas introduced from sputtering-gas supplying apparatus 150, and a voltage of the target 30 can be monitored, and further controlled by a control apparatus 160.

Description will be made to a method in which a high-purity La metal (99.9%) is used as a material of the target 30, and a LaF$_3$ thin film is formed on the substrate 90 by admitting Ar and F$_2$ into an apparatus as illustrated in FIG. 1.

A fluorite substrate is used as the substrate 90 to be treated, the substrate subjected to cleaning is put in the load-lock chamber 120, and evacuation is performed down to $1\times10^{-4}$ Pa or less. In this case, when cleaning aiming at removal of organic substances, such as heating and ultraviolet-ray irradiation cleaning, is executed for purposes of removal of organic contaminants on the substrate surface, the quality of a thin film can be effectively increased and the stability of a thin film can be effectively improved. After completion of the evacuation, the substrate is conveyed to the holder 80 via the gate valve 110, and held by the holder 80.

A heater is built in the substrate holding mechanism 80, and it is possible to form a film while heating the substrate up to 400° C. In the first example, however, an electrical power source for the heater is not turned on because film formation is executed at room temperature.

Then, the shutter 100 is closed, and Ar is introduced at 150 sccm from the sputtering-gas admitting system 150 and a mixture of F$_2$(10%)/Ar is introduced at 100 sccm from the reactive-gas admitting system 130 to set the total pressure at 0.3 Pa to 3 Pa. Further, the sputtering electrical power of 300 W is applied to the cathodic electrode 20 such that magnetron plasma can be generated on a surface of the hollow target 30. The gas admitting portion at the anode 70 is constructed so as to emit the gas toward the surface of the target 30 such that it is difficult for the reactive gas to be adsorbed by the sputtering surface of the cylindrical target 30. Here, flows, purities and pressures of the introduced gases are controlled highly precisely.

On the sputtering surface of the target 30, there is generated a magnetic field having a maximum magnetic flux density of 250 Gauss parallel to the sputtering surface and created by the above-mentioned permanent magnet 60, and an electric field perpendicular to the sputtering surface. When those magnetic and electric fields are generated perpendicularly to each other, electrons moved by the electric field applied to the target 30 are bent by the magnetic field and rotate along a circumferential direction of the cylindrical target 30 while performing a cycloidal motion. The flight distance of the electron performing the cycloidal motion is prolonged, and the probability of collision of the electron with a gas molecule is accordingly increased. The gas molecule collided with the electron is ionized, and a magnetron discharge is hence created. Since a negative voltage is applied to the target 30 by the power supplying unit 190, the ionized gas molecule is accelerated toward the sputtering surface of the target 30 and collides with the target 30. The target material is thus sputtered.

Although not shown in FIG. 1, an emission spectroscope is provided to perform spectrophotometering of light emission on the target surface. The partial pressure of the reactive gas is thus controlled such that the level of emission color of the target metal can be maintained at all times. Accordingly, a metal state of the target surface is maintained, and a stable film formation can be achieved.

Such a condition can be secured by an apparatus other than an emission spectroscope, such as a mass spectral analyzer.

The discharge is continued for some time, and the shutter 100 is opened when the discharge is found stable. A LaF$_3$ film is then formed on the substrate 90. Absorptivity, refractive index and others of the film are evaluated.

Since the structure is designed so as to spray the F$_2$ gas toward the substrate 90, the inverse diffusion of the gas to the target surface is difficult to occur. Further, the gas is introduced into a space between the target and the substrate, and the Ar gas and sputtering particles are caused to flow from the target 30 toward the substrate 90. Accordingly, the inverse diffusion can be further assuredly prevented.

In the event that a conventional ring-shaped reactive-gas admitting conduit or the like is used, it is confirmed that the phenomenon of variation of a target voltage during discharge occurs. The reason for this phenomenon is that a condition of the target surface is varied due to reaction on the target surface.

When a film is formed under such a condition, it is likely to form an uneven film whose refractive index changes in its thickness direction. Further, the sputtering rate is unstable, and the quality of the film is also unstable.

Further, where the partial pressure of F$_2$ is high and the electrical power applied to the target is small, it is likely that the sputtering rate drastically decreases, and an anomalous discharge increases. This is because LaF$_3$ is formed on the target surface. In other words, a condition of the target surface needs to be always maintained under a metal condition in order to rapidly form a LaF$_3$ film uniformly and with good reproducibility.

Figure 2:
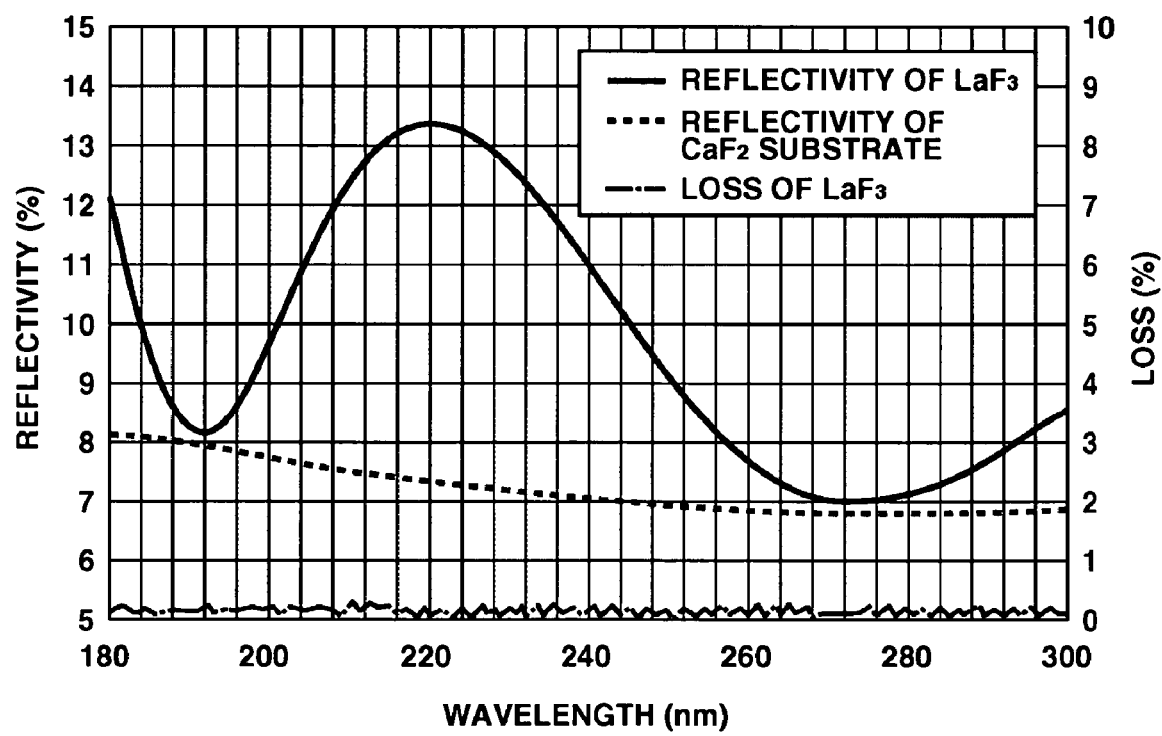
FIG. 2 is a graph showing spectral characteristics of a LaF$_3$ film obtained by the first example.

When the LaF$_3$ thin film is formed by the above-discussed method, it is possible to form a LaF$_3$ film, whose quality is not uneven and whose absorptivity is low in a range from the visible wavelength to the ultraviolet wavelength as illustrated in FIG. 2, at high rate equal to or more than 30 nm/min.

Particularly, the target voltage can be kept constant without any control. Accordingly, the sputtering rate is stabilized, and it is possible to highly precisely control the film thickness during the film forming time.

Important points of the first example are as follows.
(1) The conductance between the target and the substrate is controlled, and the sputtering gas, such as Ar, Xe and Kr, is caused to flow there into to reduce the inverse diffusion of the reactive gas.
(2) As a result of the experiment, it is particularly desirable that the conductance between the target and the substrate is equal to or less than 5 m$^3$/s.
(3) The reactive gas, such as F$_2$ and O$_2$, is introduced into a space between the target and the substrate, and emitted toward the substrate. Thereby, the inverse diffusion of the reactive gas can also be prevented by flows of the sputtering gas, such as Ar, Xe and Kr, and sputtering particles from the target.
(4) The conductance of the emitting port for the reactive gas is reduced to increase the emitting rate such that the reactive sputtering can be performed while preventing the inverse diffusion of the reactive gas to the target and reducing the partial pressure of the reactive gas near the target. Particularly, the conductance is reduced to $1\times10^{-4}$ m$^3$/s or less, and the emitting rate is maintained at 50 m/s or more.
(5) Concentrations of the reactive gas on the substrate surface and at a portion of the substrate surface, whereat the volume rate of sputtering particles from the target is high, are increased.

As a result, it is possible to stably form a LaF$_3$ thin film having preferable characteristics.

With respect to a LaF$_3$ film formed on a substrate at about room temperature (40° C. or less) in the first example, a degree of close contact is favorable and a film hardness is about equal to that of an vacuum-evaporated hard coat (heated to 300° C.). Further, its packing is about 100%, and there is almost no change of its spectral characteristics with time.

Therefore, a plastic substrate or the like can also be used as the substrate. Further, since the sputtering rate is high and stable, productivity can be improved and the film thickness can be highly precisely controlled. Accordingly, a high-quality optical thin film can be formed, and optical components, such as an antireflection film and a mirror, formed by accumulating such optical thin films can have characteristics as designed.

In the first example, La is used as the target, and Ar and $F_2$ are used as the gases. However, materials other than Ar, such as He, Ne, Kr and Xe, can be used as the inert gas. Further, other gases containing fluorine, such as $CF_4$, $NF_3$ and $SF_6$, can be used as the reactive gas in place of $F_2$. Furthermore, an oxide thin film can be formed by using a gas containing oxygen, such as $O_2$ and $H_2O$ (water vapor).

Superposition of a square voltage is not performed in the first example. However, even when superposition of a high-frequency wave at 1 kHz to 500 kHz or a square wave is executed for purposes of stabilization of discharge, an optical thin film having a low absorptivity can be obtained. In the event of the superposition of a high-frequency wave, however, a decrease in the film-forming rate can be observed. Therefore, it is more preferable to stabilize the discharge by optimizing film-forming conditions without using the superposition of a high-frequency wave.

Particularly, in the case of a fluoride thin film vulnerable to damages by plasma, it is likely that the absorptivity in an ultraviolet wavelength range increases. Therefore, when a fluoride thin film having a low absorptivity in the ultraviolet wavelength range is desired, it is preferable to use a wave at a frequency below 50 kHz.

A second example of the present invention directed to a DC sputtering apparatus will be described with reference to the drawing.

Figure 3:
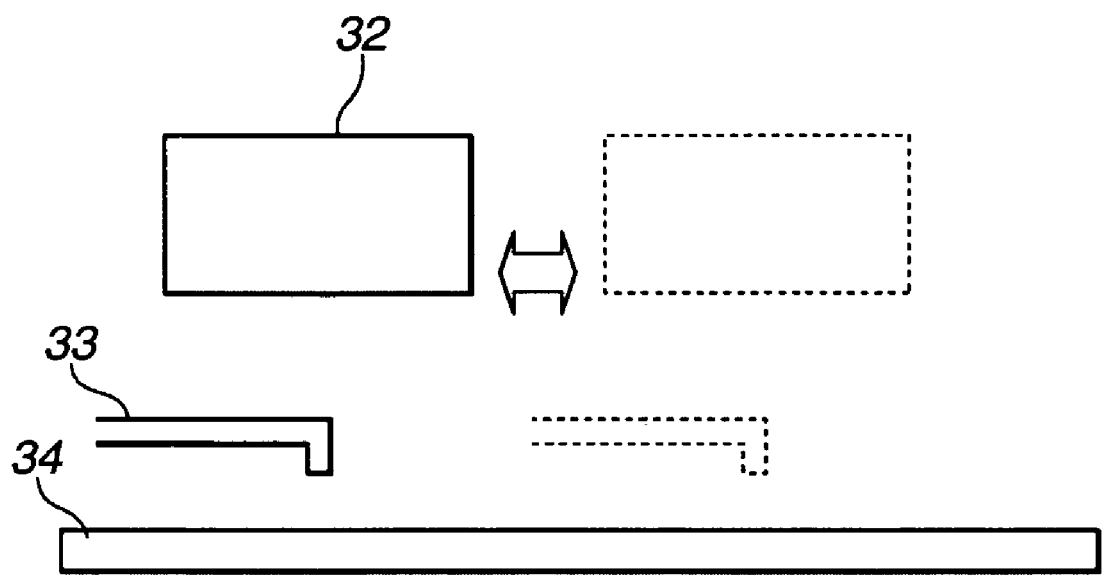
FIG. 3 is a cross-sectional view illustrating a second example of a DC magnetron sputtering apparatus according to the present invention.

FIG. 3 illustrates a cross section of a DC magnetron sputtering apparatus according to the second example. As illustrated in FIG. 3, the sputtering apparatus is provided with a movable target unit 32 with a conductance controlling chimney. It is thus designed such that a thin film can be uniformly formed on a large-area substrate 34. The target unit 32 has a construction similar to that of FIG. 1. A reactive-gas supplying conduit 33 is disposed between the target and the substrate, and the reactive gas is emitted toward the substrate.

The reactive-gas supplying conduit 33 is moved in an interlocking relationship with the movement of the target, and a relative positional relation between the conduit 33 and the target is invariant. In such a construction, a stable reactive sputtering can be performed at all times.

A third example of the present invention directed to a DC sputtering apparatus will be described with reference to the drawing.

Figure 4:
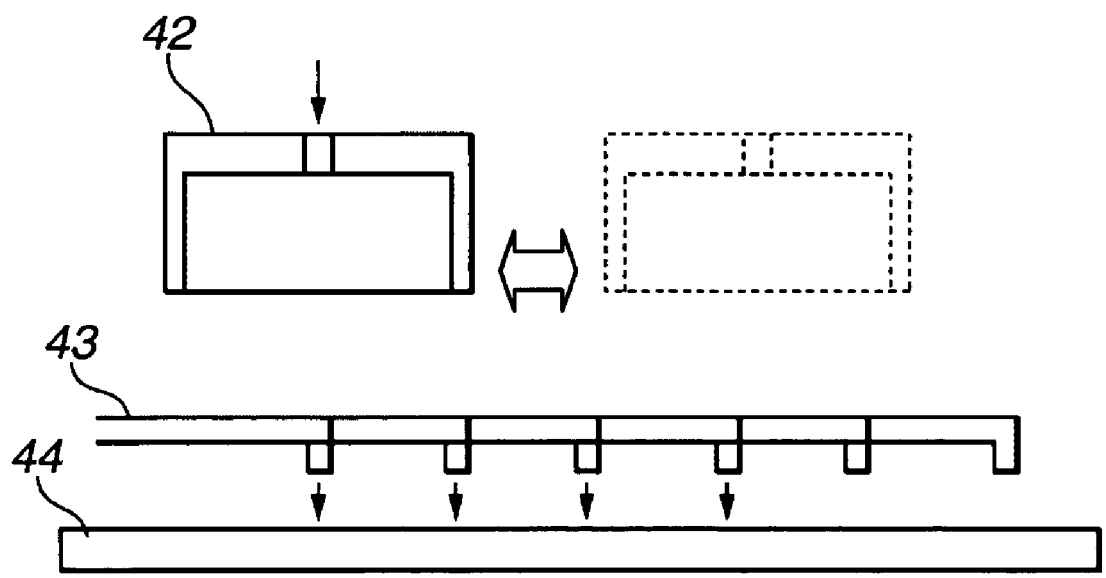
FIG. 4 is a cross-sectional view illustrating a third example of a DC magnetron sputtering apparatus according to the present invention.

FIG. 4 illustrates a cross section of a DC magnetron sputtering apparatus according to the third example. As illustrated in FIG. 4, the sputtering apparatus is provided with a movable target unit 42 with a conductance controlling chimney. It is thus designed such that a thin film can be uniformly formed on a large-area substrate 44. The target unit 42 has a construction similar to that of FIG. 1. A plurality of reactive-gas supplying conduits 43 are disposed between the target and the substrate, and a supply of the reactive gas is changeably executed by selected one of the conduits. The reactive gas is thus admitted and emitted toward the substrate.

The reactive gas supplied to the reactive-gas supplying conduit 43 is changed in an interlocking relationship with the movement of the target, and a relative positional relation between the reactive-gas admitting position and the target is hence maintained unchanged as far as possible. Further, the reactive-gas admitting position is maintained at a location between the target and the substrate. In such a construction, a stable reactive sputtering can be performed at all times.

As discussed in the foregoing, according to the present invention, sputtering can be performed while a partial pressure of the reactive gas near the target surface is reduced, and a metal condition on the target surface can be maintained at all times. As a result, the sputtering rate can be increased and stabilized.

Further, since a large concentration of the reactive gas can be attained on the substrate surface, a stable reaction can be maintained. Particularly, it is possible to increase a partial pressure of the reactive gas at a central portion of the target at which a lot of sputtering particles arrive, and a sufficient reactivity can be accordingly secured.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

This application claims priority from Japanese Patent Application No. 2003-283397 filed Jul. 31, 2003 which is hereby incorporated by reference herein.

What is claimed is:

1. A reactive sputtering method, comprising the steps of:
    disposing in an apparatus a hollow target with an opening portion provided at least at one end thereof and a supplying hole for admitting an inert gas into the interior thereof and a substrate; and
    performing sputtering by admitting an inert gas into the target through the supplying hole while spraying a reactive gas toward a surface of the substrate, and moving the target while performing said sputtering,
    wherein a conduit with plural emitting ports is used to supply the reactive gas, and the sputtering is performed by changing a reactive-gas emitting port in accordance with the movement of the target.

2. A reactive sputtering apparatus comprising:
    a vacuum chamber;
    a unit for movably retaining in the vacuum chamber a cylindrical target with an opening portion provided at least at one end thereof and a supplying hole for admitting an inert gas into an interior thereof;
    a unit for mounting a substrate;
    a unit for admitting an inert gas into the target through the supplying hole; and
    a unit for supplying a reactive gas while spraying the reactive gas toward a surface of the substrate,
    wherein said unit for supplying a reactive gas is a conduit with plural emitting ports, and the reactive-gas emitting port is changeable in accordance with the movement of the target.

* * * * *